US011289428B2

(12) United States Patent
Arita et al.

(10) Patent No.: US 11,289,428 B2
(45) Date of Patent: Mar. 29, 2022

(54) ELEMENT CHIP MANUFACTURING METHOD

(71) Applicant: Panasonic Intellectual Property Management Co., Ltd., Osaka (JP)

(72) Inventors: Kiyoshi Arita, Osaka (JP); Shogo Okita, Hyogo (JP); Hidehiko Karasaki, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 143 days.

(21) Appl. No.: 16/872,801

(22) Filed: May 12, 2020

(65) Prior Publication Data
US 2020/0381367 A1  Dec. 3, 2020

(30) Foreign Application Priority Data

May 29, 2019  (JP) .............................. JP2019-100489

(51) Int. Cl.
  *H01L 21/00*   (2006.01)
  *H01L 23/544*  (2006.01)
  *H01L 21/66*   (2006.01)
  *H01L 21/268*  (2006.01)
  *H01L 21/78*   (2006.01)
  (Continued)

(52) U.S. Cl.
  CPC ........ *H01L 23/544* (2013.01); *B23K 26/0624* (2015.10); *B23K 26/18* (2013.01); *B23K 26/351* (2015.10); *B23K 26/57* (2015.10); *H01L 21/268* (2013.01); *H01L 21/78* (2013.01); *H01L 22/20* (2013.01); *B23K 2101/40* (2018.08); *B23K 2103/50* (2018.08); *H01L 2223/5446* (2013.01); *H01L 2223/54426* (2013.01)

(58) Field of Classification Search
  CPC ....... H01L 21/268; H01L 21/78; H01L 22/20; H01L 23/544; B23K 26/0624; B23K 26/18; B23K 26/57; B23K 26/351
  USPC .......................................................... 438/13
  See application file for complete search history.

(56) References Cited

U.S. PATENT DOCUMENTS

2004/0002199 A1\* 1/2004 Fukuyo ............... B23K 26/034
                                                                 438/460
2013/0321811 A1\* 12/2013 Maeda ................... G01B 11/14
                                                                 356/400

FOREIGN PATENT DOCUMENTS

JP   2013-535114 A   9/2013
WO   2011/163149 A2  12/2011

\* cited by examiner

*Primary Examiner* — Brook Kebede
(74) *Attorney, Agent, or Firm* — Pearne & Gordon LLP

(57) ABSTRACT

An element chip manufacturing method including: preparing a semiconductor substrate including a first layer having a first principal surface, and a second layer having a second principal surface, the first layer provided with element regions, a dicing region, and an alignment mark, wherein the first layer includes a semiconductor layer, and the second layer includes a metal layer adjacent to the semiconductor layer; irradiating a first laser beam absorbed in the metal film and passing through the semiconductor layer, from the second principal surface side to a first region corresponding to the mark; imaging the semiconductor substrate from the second principal surface side with a camera, and then calculating a second region corresponding to the dicing region on the second principal surface; irradiating a second laser beam to the second region from the second principal surface side; and dicing the semiconductor substrate into a plurality of element chips.

5 Claims, 16 Drawing Sheets

(51) Int. Cl.
*B23K 26/57* (2014.01)
*B23K 26/18* (2006.01)
*B23K 26/351* (2014.01)
*B23K 26/0622* (2014.01)
*B23K 103/00* (2006.01)
*B23K 101/40* (2006.01)

ELEMENT CHIP MANUFACTURING METHOD

CROSS REFERENCE TO RELATED APPLICATION

The present application is based on and claims priority under 35 U.S.C. § 119 with respect to the Japanese Patent Application No. 2019-100489 filed on May 29, 2019, of which entire content is incorporated herein by reference into the present application.

TECHNICAL FIELD

The present invention relates to an element chip manufacturing method including a step of laser scribing a semiconductor substrate having a metal film and a semiconductor layer.

BACKGROUND

Element chips are usually manufactured by dicing a substrate including a semiconductor layer. The substrate includes a plurality of element regions and a plurality of dicing regions defining the element regions. Removing the semiconductor layer along the dicing regions divides the substrate into a plurality of element chips. Patent Document 1 (JP 2013-535114A) suggests forming groove-like gaps with a laser beam in the dicing regions known as streets, and applying a plasma to the semiconductor layer exposed from the gaps, to etch the semiconductor layer and dice the substrate.

SUMMARY

With increasing technological development of electric vehicles (EVs), the demand for element chips called power devices has been increasing. Power devices, such as power MOSFET, are used mainly for power conversion and are required to be highly resistant to pressure and heat. To meet such requirements, some power devices are configured such that current flows in the thickness direction, and include a metal film provided on the back side. Such element chips are obtained by, for example, dicing a substrate including a metal film and a semiconductor layer. However, especially when the metal film contains a metal with high melting point, which is poor in reactivity, it is difficult to etch the metal film with a plasma.

One aspect of the present invention relates to an element chip manufacturing method including: a preparation step of preparing a semiconductor substrate including a first layer having a first principal surface, and a second layer laminated on the first layer and having a second principal surface opposite the first principal surface, the first principal surface provided with a plurality of element regions, a dicing region defining the element regions, and an alignment mark, wherein the first layer includes a semiconductor layer, and the second layer includes a metal layer adjacent to the semiconductor layer; a first exposure step of irradiating a first laser beam that is absorbed in the metal film and passes through the semiconductor layer, from the second principal surface side to a first region corresponding to the alignment mark on the second principal surface, to remove the metal film at the first region and expose the semiconductor layer corresponding to the first region; a calculation step of imaging the semiconductor substrate from the second principal surface side, with a camera capable of sensing an electromagnetic wave that passes through the semiconductor layer, to detect a position of the alignment mark through the semiconductor layer corresponding to the first region, and then calculating a second region corresponding to the dicing region on the second principal surface, based on the detected position of the alignment mark; a second exposure step of irradiating a second laser beam to the second region from the second principal surface side, to remove the metal film along the second region and expose the semiconductor layer corresponding to the second region; and a dicing step of removing the exposed semiconductor layer along the second region after the second exposure step, to divide the semiconductor substrate into a plurality of element chips.

According to the present invention, a semiconductor substrate including a metal film can be diced with high precision.

DETAILED DESCRIPTION

Figure 1:
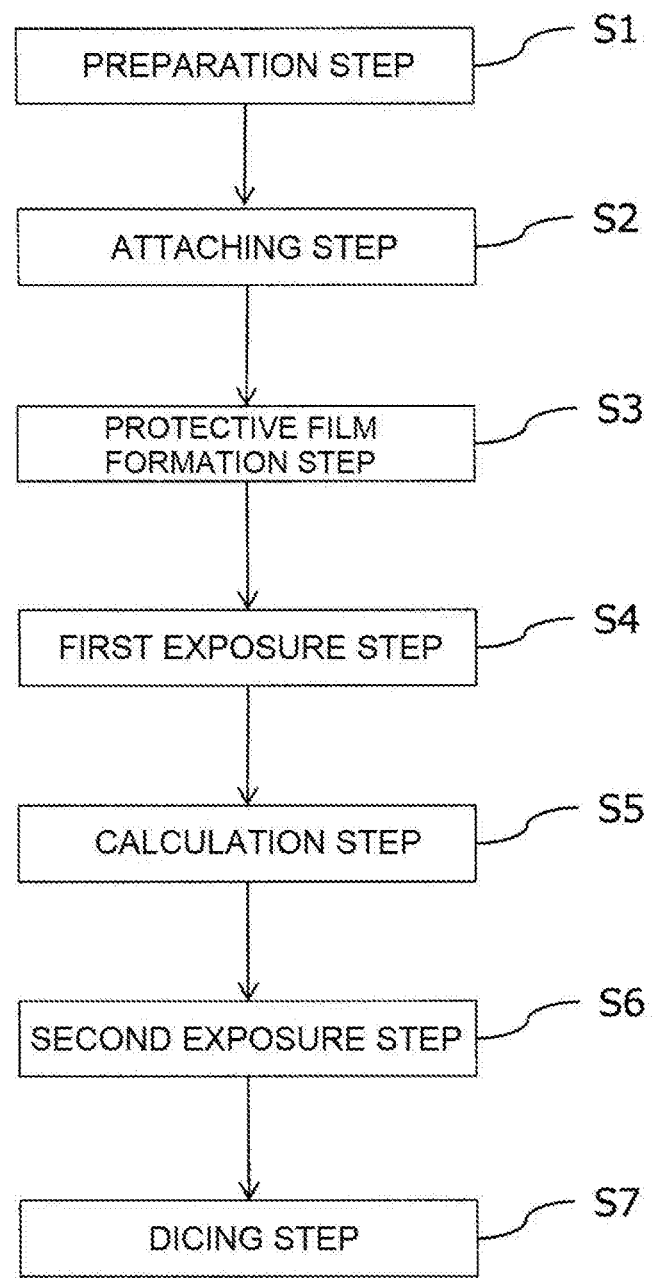
FIG. 1 is a flowchart of a manufacturing method according to one embodiment of the present invention.

In one exemplary method to dice a semiconductor substrate including a metal film and a semiconductor layer, plasma etching is applied to the semiconductor layer along the dicing region from the surface opposite the metal film, and then, the remaining metal film is removed with a laser beam. In this method, however, debris derived from the metal film often adhere on the side face of the diced semiconductor layer. In another exemplary method, the metal film is removed along the dicing region with a laser beam, and then, plasma etching is applied to the semiconductor layer. To remove the metal film along the dicing region, it is necessary to identify exactly where the dicing region is. A mark indicating the dicing region or a mark used for positioning (hereinafter collectively referred to as an alignment mark), however, is usually provided on the surface opposite the metal film of the semiconductor substrate, and is difficult to identify from the metal film side.

An embodiment of the present invention relates to the latter method of removing part of the metal film first.

In the present embodiment, a portion corresponding to the alignment mark of the metal film (i.e., first region) is removed first with a laser beam from the metal film side. The alignment mark is provided on the surface opposite the metal film. The positioning at this time does not require high accuracy. It is only necessary to identify an approximate position of the alignment mark. This is because the first region can be set sufficiently larger in area than the alignment mark.

Next, the alignment mark is detected from the metal film side through the semiconductor layer corresponding to the first region where the metal film is removed. Then, the detected alignment mark is used to calculate the exact position of the dicing region. In this way, a laser beam can be irradiated with high precision on the metal film corresponding to the dicing region, from the second principal surface side from which the dicing region is difficult to identify due to the presence of the metal film.

Furthermore, for the removal of the metal film at the first region, a first laser beam is used that is absorbed in the metal film and passes through the semiconductor layer. Therefore, during the removal of the metal film, the surface of the semiconductor layer beneath the metal film is unlikely to be roughened, and the crystal inside the layer is unlikely to be disordered. Thus, the alignment mark can be clearly detected through the semiconductor layer, and this further improves the positional accuracy.

For the detection of the alignment mark, a camera is used that is capable of sensing an electromagnetic wave that passes through the semiconductor layer. Thus, the alignment mark can be detected from the metal film side. In other words, the camera and the laser irradiator can be placed on the same surface side of the semiconductor substrate, which can simplify the apparatus configuration. For example, when an X-ray is irradiated to the semiconductor substrate, and the difference in the transmittance of the X-ray is used to detect the position of the alignment mark, an X-ray detector and an X-ray irradiator must be placed so as to face each other with the semiconductor substrate therebetween, resulting in complicated apparatus configuration. Moreover, X-ray irradiators have a short working life, which is disadvantageous in terms of cost.

Specifically, a manufacturing method according to the present embodiment includes: a preparation step of preparing a semiconductor substrate including a first layer having a first principal surface, and a second layer laminated on the first layer and having a second principal surface opposite the first principal surface, the first principal surface provided with a plurality of element regions, a dicing region defining the element regions, and an alignment mark, wherein the first layer includes a semiconductor layer, and the second layer includes a metal layer adjacent to the semiconductor layer; a first exposure step of irradiating a first laser beam that is absorbed in the metal film and passes through the semiconductor layer, from the second principal surface side to a first region corresponding to the alignment mark on the second principal surface, to remove the metal film at the first region and expose the semiconductor layer corresponding to the first region; a calculation step of imaging the semiconductor substrate from the second principal surface side, with a camera capable of sensing an electromagnetic wave that passes through the semiconductor layer, to detect a position of the alignment mark through the semiconductor layer corresponding to the first region, and then calculating a second region corresponding to the dicing region on the second principal surface, based on the detected position of the alignment mark; a second exposure step of irradiating a second laser beam to the second region from the second principal surface side, to remove the metal film along the second region and expose the semiconductor layer corresponding to the second region; and a dicing step of removing the exposed semiconductor layer along the second region after the second exposure step, to divide the semiconductor substrate into a plurality of element chips.

In the dicing step, the semiconductor layer may be removed by applying a plasma to the second region from the second principal surface side. The manufacturing method according to the present embodiment is particularly suitable when including a plasma dicing process. In this case, the method preferably further includes, after the preparation step and before the first exposure step, a protective film formation step of forming a protective film so as to cover the second principal surface of the semiconductor substrate. In addition, in view of ease of handling, the method preferably further includes, after the preparation step and before the first exposure step, an attaching step of attaching the semiconductor substrate at the first principal surface to a holding sheet. Although the protective film formation step and the attaching step may be performed in any order, it is preferable to perform the attaching step first, in view of workability.

A manufacturing method according to the present embodiment will be described below with reference to the drawings as appropriate.

FIG. 1 is a flowchart of the manufacturing method according to the present embodiment.

(1) Preparation Step (S1)

A semiconductor substrate subjected to dicing is prepared first.

(Semiconductor Substrate)

The semiconductor substrate includes: a first layer having a first principal surface, the surface provided with a plurality of element regions, a dicing region defining the element regions, and an alignment mark; and a second layer laminated on the first layer and having a second principal surface opposite the first principal surface. The first layer includes a semiconductor layer, and the second layer includes a metal layer adjacent to the semiconductor layer.

The first layer may further include a wiring layer and an electrically insulating film on the first principal surface side. In this case, the semiconductor substrate in the element regions includes, for example, the wiring layer, the semiconductor layer, and the metal film. The semiconductor substrate in the dicing region includes, for example, the insulating film, the semiconductor layer, and the metal film. The insulating film may include a metal material, such as TEG (Test Element Group). By etching the semiconductor substrate along the dicing region in the thickness direction, element chips can be obtained.

The semiconductor substrate may be of any size, and the maximum diameter thereof is, for example, 50 mm or more and 300 mm or less. The semiconductor substrate may be of any shape, and is, for example, circular or rectangular. The semiconductor substrate may be provided with a cut, such as an orientation flat or a notch.

The semiconductor layer contains, for example, silicon (Si), gallium arsenide (GaAs), gallium nitride (GaN), or silicon carbide (SiC). The semiconductor layer in the element chip may have any thickness; the thickness is, for example, 20 µm or more and 1000 µm or less, and may be 100 µm or more and 300 µm or less.

The wiring layer constitutes, for example, a semiconductor circuit, an electronic component element, or MEMS, and may include an electrically insulating film, a metal material, a resin layer (e.g., polyimide), a resist layer, an electrode pad, a bump, and others. The insulating film may be in the form of a laminate with a wiring metal material (e.g., multilevel wiring layer, redistribution layer).

The shape of the dicing region may be set as appropriate according to the shape of desired element chips, without limited to a straight linear shape, and may be, for example, a zigzag shape or a wavy line shape. The element chip is, for example, rectangular or hexagonal in shape.

The width of the dicing region may be set as appropriate according to the sizes of the substrate and the element chips, and others. The width of the dicing region is, for example, 10 µm or more and 300 µm or less. A plurality of the dicing regions may have the same width or different widths. The dicing region is typically formed in plural numbers on the substrate. The pitch between the dicing regions adjacent to each other also may be set as appropriate according to the sizes of the substrate and the element chips, and others.

The alignment mark is provided on the first principal surface, for positioning of the semiconductor substrate. The alignment mark is not limited, but may be a mark indicating the boundary between the dicing region and the element regions (e.g., a metal pattern called a seal or seal ring, an electrically insulating material pattern called a scribe line), and may be a mark specially provided for positioning. The alignment mark can be usually distinguished from the semiconductor layer and the wiring layer by image recognition. The shape of the alignment mark is not limited. The shape of the alignment mark may be a combination of straight lines (e.g., parallel lines, grid pattern lines), and may be, for example, a cross shape, a circle shape, or a rectangle shape. The alignment mark other than a boundary line is provided, for example, in an outer peripheral portion of the semiconductor substrate within the dicing region. The alignment mark may be provided in the element region, if necessary.

The metal film is formed nearer to the second principal surface side than the semiconductor layer is, in order to, for example, flow a current in the thickness direction or facilitate the heat dissipation. The metal film is preferably disposed outermost on the second principal surface side. Although the metal film and the semiconductor layer are disposed adjacent to each other, another layer, such as an adhesive layer, may be interposed therebetween. Examples of the material of the metal film include silver, copper, aluminum, aluminum alloy, tungsten, nickel, gold, platinum, and titanium. The metal film is, for example, vapor-deposited or attached onto the semiconductor layer. The metal film may be a single-layer film, and may be a multi-layered film. The metal film may be, for example, obtained by laminating titanium, nickel and gold in this order on the semiconductor layer (Au/Ni/Ti), or laminating titanium, nickel and silver in this order on the semiconductor layer (Ag/Ni/Ti), or laminating titanium, nickel and aluminum alloy in this order on the semiconductor layer (Al alloy/Ni/Ti).

The thickness of the metal film (total thickness) may be set as appropriate according to the use of the element chips. The thickness of the metal film is, for example, 50 nm or more and 100 µm or less. When the metal film is a laminate of Au/Ni/Ti, for example, the Au film thickness is 50 nm or more and 200 nm or less, the Ni film thickness is 200 nm or more and 400 nm or less, and the Ti film thickness is 100 nm or more and 300 nm or less. When the metal film is a laminate of Ag/Ni/Ti, for example, the Ag film thickness is 200 nm or more and 30 µm or less, the Ni film thickness is 200 nm or more and 400 nm or less, and the Ti film thickness is 100 nm or more and 300 nm or less. When the metal film is a laminate of Al alloy/Ni/Ti, for example, the Al-alloy film thickness is 200 nm or more and 30 µm or less, the Ni film thickness is 200 nm or more and 400 nm or less, and the Ti film thickness is 100 nm or more and 300 nm or less.

Figure 2A:
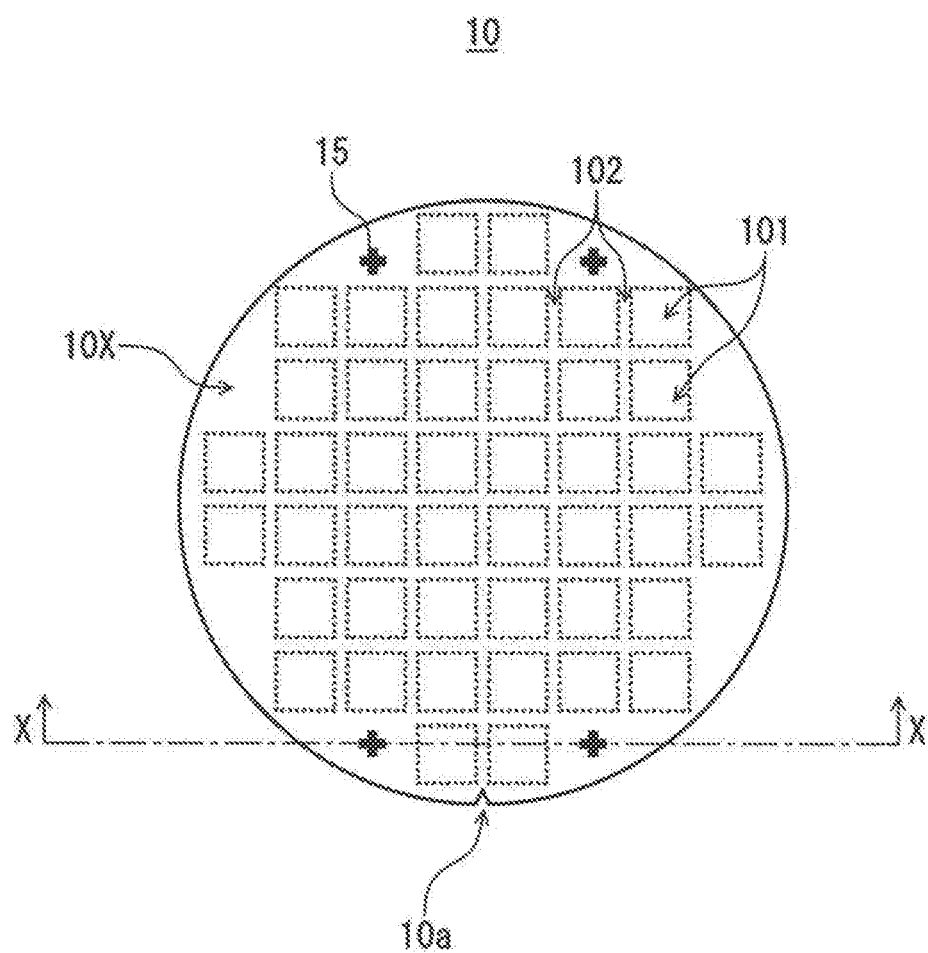
FIG. 2A is a schematic top view of a semiconductor substrate according to one embodiment of the present invention.
Figure 2B:
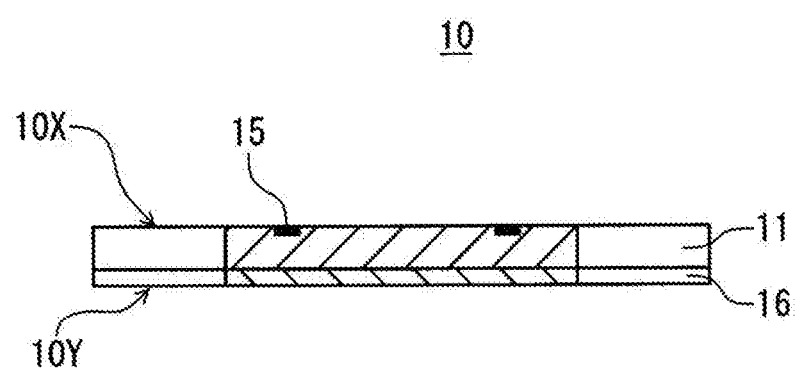
FIG. 2B is a cross-sectional view of the semiconductor substrate of FIG. 2A taken along a line X-X.

FIG. 2A is a schematic top view of a semiconductor substrate seen from the first principal surface side, and FIG. 2B is a cross-sectional view of the semiconductor substrate of FIG. 2A taken along a line X-X.

The semiconductor substrate 10 includes: a first layer having a first principal surface 10X, the surface provided with a plurality of element regions 101, a dicing region 102 defining the element regions 101, and an alignment mark 15; and a second layer laminated on the first layer and having a second principal surface 10Y opposite the first principal surface 10X. The first layer incudes a semiconductor layer 11, and the second layer includes a metal layer 16 adjacent to the semiconductor layer 11. On the outer periphery of the first principal surface 10X, the alignment mark 15 shaped like a cross is provided at four positions. The semiconductor substrate 10 includes one notch 10a.

(2) Attaching Step (S2)

After the preparation step and before a first exposure step, the semiconductor substrate may be attached at the first principal surface to a holding sheet. This increases the ease of handling of the semiconductor substrate.

(Holding Sheet)

For further increased ease of handling, a holding sheet may be secured to a frame. The semiconductor substrate is subjected to each step, for example, in a state of being held by a conveying carrier including a frame and a holding sheet secured to the frame.

The frame is a frame member having an opening equal to or greater in area than the whole semiconductor substrate, and has a predetermined width and a substantially consistent thin thickness. The frame has such a rigidity that it can be conveyed with the holding sheet and the semiconductor substrate held thereon. The opening of the frame may be of any shape, for example, circular, rectangular, or polygonal, such as hexagonal. The frame may be made of any material, for example, a metal, such as aluminum or stainless steel, or a resin.

The holding sheet may be made of any material. For easy attachment of the semiconductor substrate thereto, the holding sheet preferably includes an adhesive layer and a non-adhesive layer with flexibility.

The non-adhesive layer may be made of any material, for example, polyolefin such as polyethylene and polypropylene, polyester such as polyvinyl chloride and polyethylene terephthalate, and other thermoplastic resins. The resin film may include a rubber component for adding elasticity (e.g., ethylene-propylene rubber (EPM), ethylene-propylene-diene rubber (EPDM)), and various additives, such as a plasticizer, a softener, an antioxidant, and an electrically conductive material. The thermoplastic resin may have a functional group that reacts during photopolymerization reaction, such as an acryl group. The non-adhesive layer may have any thickness; the thickness is, for example, 50 μm or more and 300 μm or less, preferably 50 μm or more and 150 μm or less.

The holding sheet is attached at its periphery to the frame, with the side where the adhesive layer is disposed (adhesive side) in contact with the frame, to cover the opening of the frame. On the adhesive side exposed from the opening of the frame, the semiconductor substrate is attached, with one of its principal surfaces (second surface) in contact with the adhesive side. The semiconductor substrate is thus held on the holding sheet. The semiconductor substrate may be held on the holding sheet via a die attach film (DAF).

The adhesive layer is preferably made of an adhesive component, the adhesive strength of which is reduced by ultraviolet (UV) irradiation. In picking up the element chips after dicing, the element chips can be easily peeled off from the adhesive layer by UV irradiation, which eases the pickup. The adhesive layer can be obtained by, for example, applying a UV curing acrylic adhesive on one side of the non-adhesive layer, in a thickness of 5 μm or more and 100 μm or less (preferably 5 μm or more and 15 μm or less).

Figure 3:
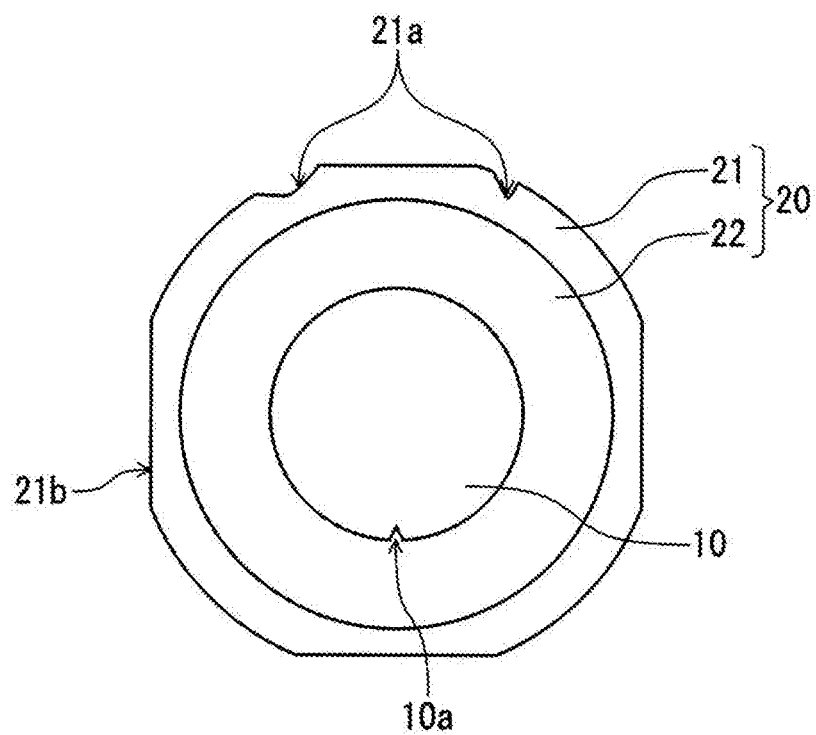
FIG. 3 is a schematic top view of a conveying carrier and the semiconductor substrate held thereon.
Figure 4:
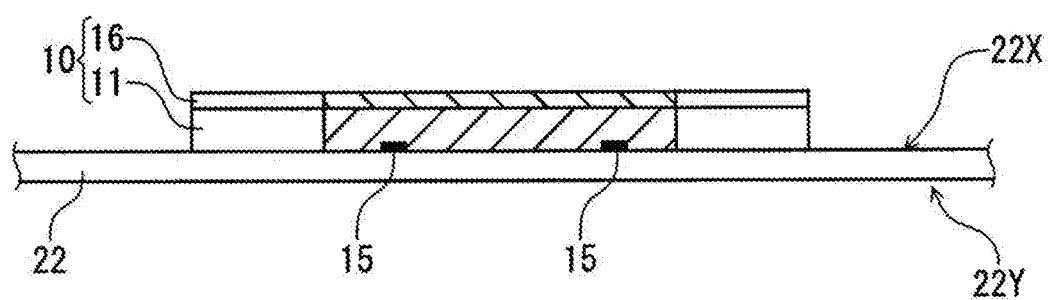
FIG. 4 is a cross-sectional view taken along the line X-X in FIG. 2A of the semiconductor substrate after an attaching step according to one embodiment of the present invention.

FIG. 3 is a schematic top plan view of the conveying carrier and the semiconductor substrate held thereon. FIG. 4 is a cross-sectional view taken along the line X-X in FIG. 2A of the semiconductor substrate after the attaching step according to the present embodiment. A conveying carrier 20 includes a frame 21 and a holding sheet 22 secured to the frame 21. The frame 21 may be provided with a notch 21a and a corner cut 21b for correct positioning. An adhesive side 22X is attached at its periphery to one side of the frame 21, and on the adhesive side 22X exposed from the opening of the frame 21, one of the principal surfaces of the semiconductor substrate 10 is attached. In plasma processing, the holding sheet 22 is placed on a stage in a plasma processing apparatus, such that a non-adhesive side 22Y opposite the adhesive side 22X comes in contact with the stage.

(3) Protective Film Formation Step (S3)

When a dicing step is performed using a plasma, it is desirable to form a protective film so as to cover the second principal surface of the semiconductor substrate. The protective film protects the metal film corresponding to the element region, from the plasma. The protective film corresponding to the first region is removed in the first exposure step, together with the metal film. The protective film corresponding to the second region is removed in a second exposure step, together with the metal film.

(Protective Film)

The protective film contains a resist material, such as a thermosetting resin (e.g., polyimide), a photoresist (e.g., phenol resin), or a water-soluble resist (e.g., acrylic resin). The protective film can be formed by, for example, forming a resist material into a sheet and laminating the second principal surface with the sheet, or by applying a liquid raw material of a resist material to the second principal surface using a spin-coating or spray-coating technique.

The protective film may have any thickness, but is preferably thick enough not to be completely removed in the plasma dicing step. The thickness of the protective film is set, for example, to be greater than a calculated amount (thickness) of the protective film to be etched in the plasma dicing step.

Figure 5:
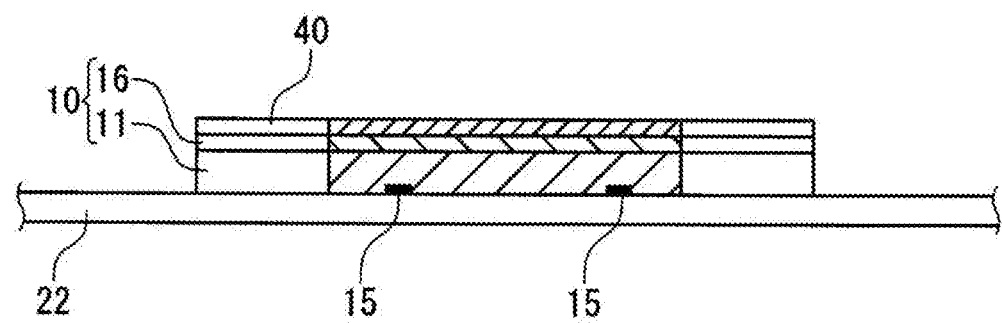
FIG. 5 is a cross-sectional view taken along the line X-X in FIG. 2A of the semiconductor substrate after a protective film formation step according to the embodiment of the present invention.

FIG. 5 is a cross-sectional view taken along the line X-X in FIG. 2A of the semiconductor substrate after the protective film formation step according to the present embodiment. A protective film 40 is formed so as to cover the metal film 16 of the semiconductor substrate 10.

(4) First Exposure Step (S4)

This step irradiates a first laser beam that is absorbed in the metal film and passes through the semiconductor layer, to a region (first region) corresponding to the alignment mark on the second principal surface. This removes the protective film and the metal film at the first region and exposes the semiconductor layer corresponding to the first region.

(First Region)

The first region is determined, for example, from the position of a cut, such as an orientation flat or notch, provided on the semiconductor substrate, or from the position of a cut, such as a corner cut or notch, provided on the frame, with reference to a design drawing. The design drawing shows the positional relationship between each cut and the alignment mark. Part of the second principal surface corresponding to the alignment mark as determined from the position of the cut is referred to as the first region. In other words, at least part of the alignment mark and at least part of the first region face each other, and when seen from the direction normal to the second principal surface, at least part of the alignment mark overlaps the first region.

The position of the alignment mark determined as described above sometimes disagrees with the actual position. The misalignment, however, is permissible if it is about several hundred μm. Here, a relatively wide region corresponding to the alignment mark is defined as the first region on the second principal surface.

When the alignment mark is a boundary line, the first region includes part of at least two boundary lines (e.g., an intersection of grid-pattern boundary lines, part of two adjacent parallel lines). The first region as above has, for example, an arc or annular shape along the outer periphery of the semiconductor substrate. When the alignment mark is other than a boundary line, the whole alignment mark as seen from the direction normal to the second principal surface overlaps the first region. In this case, given that a circumscribed circle is drawn around the alignment mark, a circular or rectangular region overlapping the circle and having a diameter of about 5 to 10 times larger than the diameter of the circle can be determined as the first region.

The first region is preferably determined such that the metal film does not enter the field of view of a camera used in a calculation step. This is to avoid misidentifying the metal film as the alignment mark. For example, when the diameter of the circumscribed circle is 100 μm, and the field of view of the camera is 300 μm square, the diameter of the first region (or major axis) is about 500 μm.

(First Laser Beam)

The first laser beam, while being absorbed in the metal film, passes through the semiconductor layer. Therefore, the irradiation of the first laser beam can remove the metal film; however, the surface of the semiconductor layer beneath the metal film is unlikely to be roughened, and the crystal inside the semiconductor layer is unlikely to be disordered by the irradiation. Thus, the electromagnetic wave can pass through the semiconductor layer without causing scattering etc., allowing the alignment mark to be clearly detected through the semiconductor layer. In this way, the second region can be thus calculated with high accuracy.

In view of suppressing the damage to the semiconductor layer, the first laser beam is preferably to have a wavelength hardly absorbed in the semiconductor. For example, when the semiconductor layer is a silicon layer, the first laser beam may have a wavelength of 750 nm or more and 20 μm or less. For better light collecting performance, a shorter wavelength is preferred. Specifically, the wavelength of the first laser beam may be in a near-infrared range (750 nm or more and 1500 nm or less), and may be 950 nm or more and 1500 nm or less. More specifically, the wavelength of the first laser beam may be 1064 nm or 1030 nm.

The first laser beam may have any frequency; the frequency is, for example, 1 kHz or more and 200 kHz or less. The first laser beam may be of any laser oscillation mechanism. Examples of the first laser include: a semiconductor laser using a semiconductor as a laser oscillation medium; a gas laser using a gas, such as carbon dioxide ($CO_2$), as the medium; a solid laser using YAG; and a fiber laser. Any laser oscillator may be used for laser generation. For example, a pulse laser oscillator for emitting a pulse laser beam may be used because of its low thermal impact on the semiconductor substrate.

The laser beam may have any pulse width. In view of reducing the thermal impact and preventing the damage to the semiconductor layer, the pulse width is preferably 500 nanoseconds or less, more preferably 200 nanoseconds or less. Particularly preferred is an ultrashort pulse laser beam having a pulse width of several femtoseconds ($1\times10^{-15}$ sec) or several hundred femtoseconds ($100\times10^{-15}$ sec) to 100 picoseconds ($100\times10^{-12}$ sec).

The laser irradiator includes: for example, an arm for delivering a semiconductor substrate; a stage for supporting the semiconductor substrate; an irradiation head for irradiating a laser beam; a driving unit for driving the stage; an input unit for receiving input data related to the dicing region, the first region and/or the alignment mark; an imaging unit for imaging the semiconductor substrate supported on the stage; an image processing unit for detecting the shape etc. of the imaged semiconductor substrate; an arithmetic logical unit for determining the position of the semiconductor substrate, the first region and/or the second region, based on the input data and the shape etc. of the semiconductor substrate detected by the image processing unit; and a controller for controlling these operations.

The input unit includes, for example, a touch panel. For example, an operator inputs various data into the input unit. The controller, the image processing unit and the arithmetic logical unit includes, for example, a computer. The imaging unit includes a camera. The driving unit includes, for example, a ball screw and a linear guide system. The rotation of the ball screw moves the stage translationally and/or vertically under the irradiation head and the camera.

Figure 6:
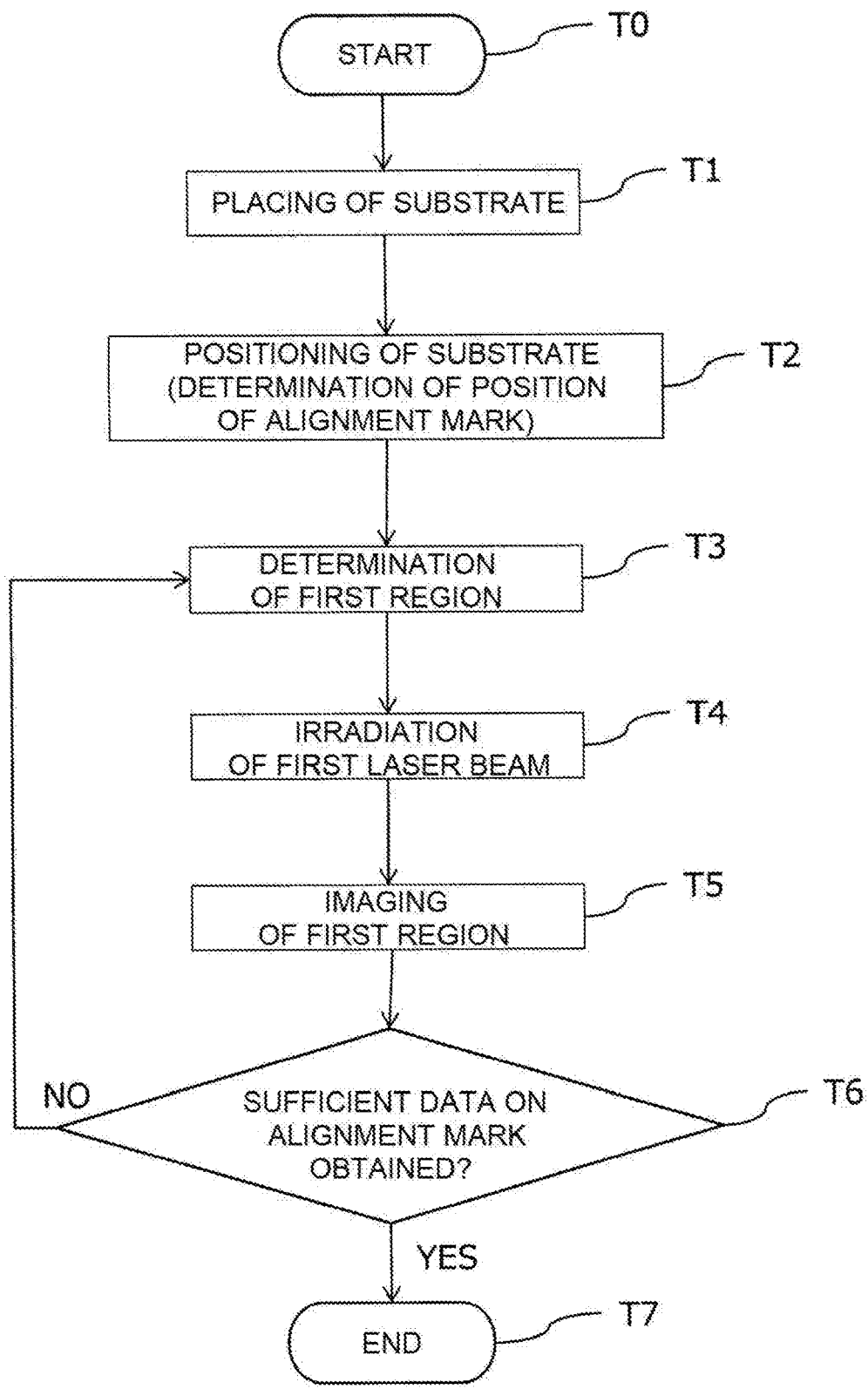
FIG. 6 is a flowchart of an operation of a laser irradiator in a first exposure step according to the embodiment of the present invention.

FIG. 6 is a flowchart of an operation of a laser irradiator in the first exposure step according to the present embodiment.

Upon inputting of necessary data into the input unit, the operation in the first exposure step of the laser irradiator starts (T0). A semiconductor substrate delivered into the laser irradiator is passed onto the arm and placed on the stage (T1). The stage is provided with a protrusion at a position corresponding to the cut in the semiconductor substrate or in the frame, and thus, the semiconductor substrate can be positioned on the stage. Alternatively, after placed on the stage, the semiconductor substrate may be imaged, so that the position of the cut can be detected with the image processing unit. In this case, after the detection of the position of the cut, the arithmetic logical unit calculates where the semiconductor substrate is to be positioned on the stage. Upon positioning of the semiconductor substrate on the stage, the arithmetic logical unit determines the position of the alignment mark with reference to the data in the input unit (T2).

The arithmetic logical unit further determines the position of the outer periphery or center of the first region, based on the position of the alignment mark (T3). The size, shape, etc. of the first region are input into the input unit in advance. Alternatively, the size, shape, etc. of the alignment mark may be input in advance into the input unit. In this case, the arithmetic logical unit calculates an appropriate first region.

The driving unit drives the stage, to bring the determined outer periphery or center of the first region under the irradiation head. When the semiconductor substrate is placed at a predetermined position under the irradiation head, an irradiation unit starts irradiation of the first laser beam (T4). While the first laser beam is irradiated, the driving unit further drives the stage to move in the plane direction, based on the input data such as size and shape of the first region. This removes the protective film and the metal film at the first region.

Upon completion of a series of processing, the first region may be imaged from above (T5). If a predetermined information (e.g., sufficient data showing the position of the alignment mark) cannot be collected from the processed image of the alignment mark (T6), the processing after the determination of the position of the first region (T3 to T5) may be performed again. Then, the operation in the first exposure step of the laser irradiator ends (T7).

When the alignment mark is provided at two or more places, a series of these processing may be performed for each of the alignment marks. In this case, the driving unit may be driven to bring the semiconductor substrate under the camera installed in the imaging unit, so that the camera can take the images of the alignment marks one mark after another.

Figure 7A:
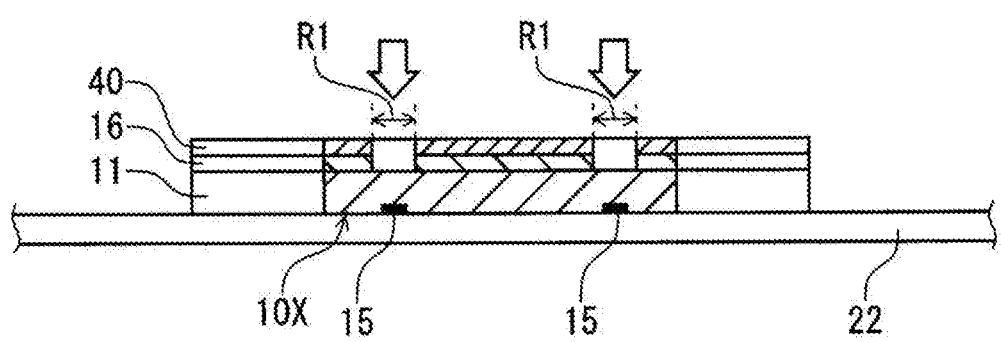
FIGS. 7A and 7B are a cross-sectional view taken along the line X-X in FIG. 2A and a schematic top view, respectively, of the semiconductor substrate after the first exposure step according to the embodiment of the present invention.
Figure 7B:
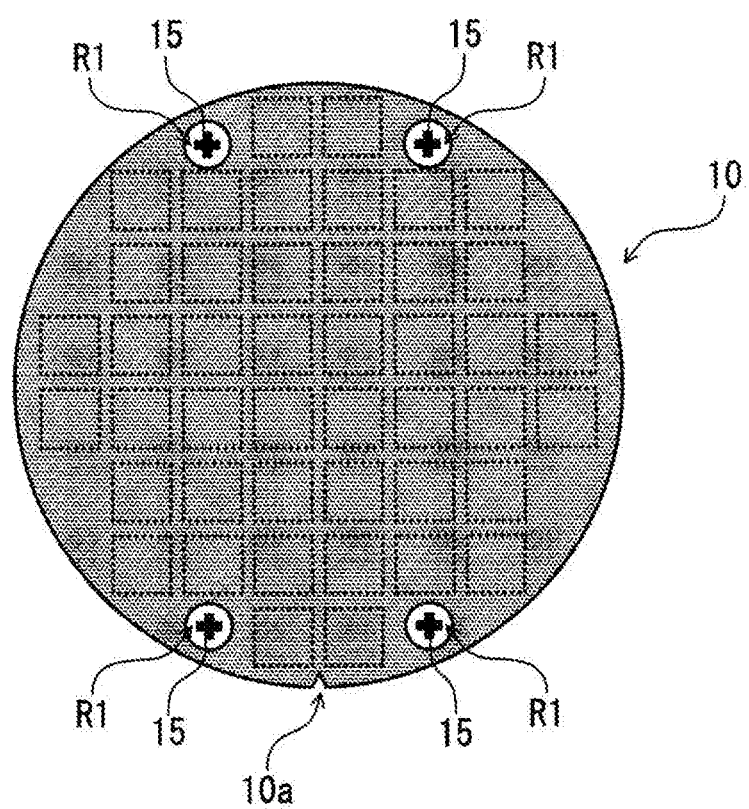

FIGS. 7A and 7B are a cross-sectional view taken along the line X-X in FIG. 2A and a schematic top view, respectively, of the semiconductor substrate after the first exposure step according to the present embodiment. The four alignment marks 15 are provided on the first principal surface 10X of the semiconductor substrate 10. The protective film 40 and the metal film 16 in a first region R1 at four places are removed so as to expose these alignment marks entirely at each place. The first region R1 is a circular region surrounding the alignment mark 15. In FIG. 7B, the protective film 40 is shown by hatching for the sake of convenience.

(5) Calculation Step (S5)

This step images the semiconductor substrate from the second principal surface side with a camera capable of sensing an electromagnetic wave that passes through the semiconductor layer, to detect the position and the shape etc. of the alignment mark through the semiconductor layer corresponding to the first region. This step then calculates a second region corresponding to the dicing region on the second principal surface, based on the detected data related to the alignment mark.

(Camera)

The camera is capable of sensing an electromagnetic wave that passes through the semiconductor layer. It is therefore possible to image the alignment mark through the semiconductor layer corresponding to the first region from the second principal surface side.

The camera is an infrared camera capable of sensing an electromagnetic wave ranging, for example, from the near-infrared to the far-infrared (in a wavelength range of 750 nm or more and 1000 μm or less). The infrared camera constitutes the imaging unit. The imaging unit may include a camera other than the infrared camera (e.g., a camera capable of sensing visible light). The imaging unit may include a plurality of infrared cameras. The field of view of the infrared camera is not limited, but may be 300 μm square or more, in view of improvement of accuracy.

(Second Region)

The second region is calculated from the detected position of the alignment mark and the data in the input unit. The second region is part of the second principal surface corresponding to the dicing region. In other words, at least part of the dicing region and at least part of the second region face each other, and when seen from the direction normal to the second principal surface, at least the part of the dicing region overlaps the second region. Preferably, the dicing region entirely overlaps the second region.

Figure 8:
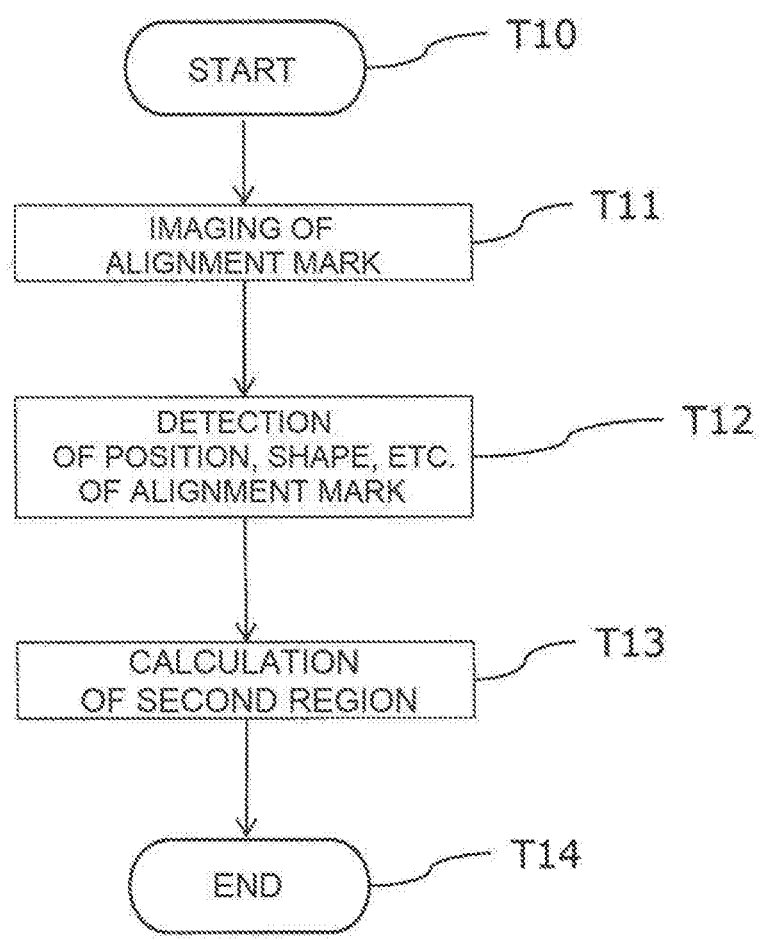
FIG. 8 is a flowchart of an operation of the laser irradiator in a calculation step according to the embodiment of the present invention.

FIG. 8 is a flowchart of an operation of the laser irradiator in the calculation step according to the present embodiment.

Upon completion of the first exposure step, the operation in the calculation step of the laser irradiator starts (T10). The driving unit drives the stage, to bring the first region under the infrared camera. The imaging unit images the alignment mark through the semiconductor layer corresponding to the first region, from the second principal surface side, with the infrared camera (T11). The image processing unit processes the captured image to detect the position and the shape etc. of the alignment mark (T12). The arithmetic logical unit calculates the position of the dicing region on the second principal surface, based on the detected data related to the alignment mark and the input data related to the dicing region (T13). This determines the second region corresponding to the dicing region on the second principal surface. Then, the operation in the calculation step of the laser irradiator ends (T14).

Figure 9:
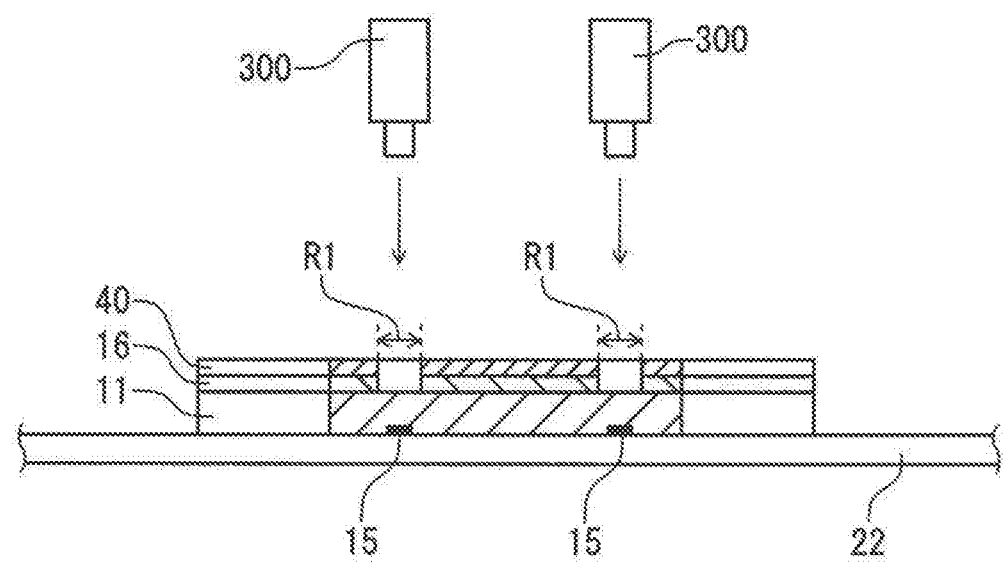
FIG. 9 is a cross-sectional view taken along the line X-X in FIG. 2A of the semiconductor substrate during the calculation step according to the embodiment of the present invention.

FIG. 9 is a cross-sectional view taken along the line X-X in FIG. 2A of the semiconductor substrate during the calculation step according to the present embodiment. An infrared camera 300 captures an image of the alignment mark 15 through the semiconductor layer 11 corresponding to the first region R1. The captured image is processed to detect the shape etc. of the alignment mark 15. Based on the detected shape etc. of the alignment mark 15, the position of the dicing region is calculated.

(6) Second Exposure Step (S6)

This step irradiates a second laser beam to the second region from the second principal surface side, to remove the protective film and the metal film along the second region. As a result, the semiconductor layer corresponding to the second region is exposed.

The driving unit drives the stage, to bring the semiconductor substrate under the irradiation head such that the side face faces the head. When the semiconductor substrate is placed at a predetermined position, the irradiation unit starts irradiation of the second laser beam to the second region. While the second laser beam is irradiated, the driving unit further drives the stage to move in the plane direction, based on the size, shape, etc. of the second region. This removes the protective film and the metal film along the second region.

The second laser beam may be emitted by the similar mechanism and under the similar conditions to those of the first laser beam. Particularly when the second laser beam is an ultrashort pulse laser beam, the damage on the semiconductor layer can be suppressed, and a desired plasma etching tends to be achieved.

After the first exposure step and/or after the second exposure step, the exposed semiconductor layer may be irradiated with a third laser beam. This can improve the smoothness of the semiconductor layer. The third laser beam may be, for example, a long pulse laser beam having a pulse width of several hundred nm/s, or a laser beam having a flat-top profile (top-hat profile).

Figure 10A:
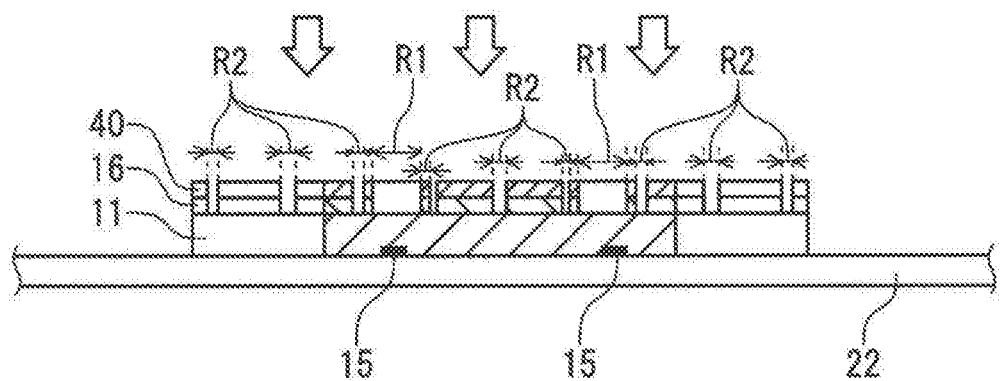
FIGS. 10A and 10B are a cross-sectional view taken along the line X-X in FIG. 2A and a schematic top view, respectively, of the semiconductor substrate after a second exposure step according to the embodiment of the present invention.
Figure 10B:
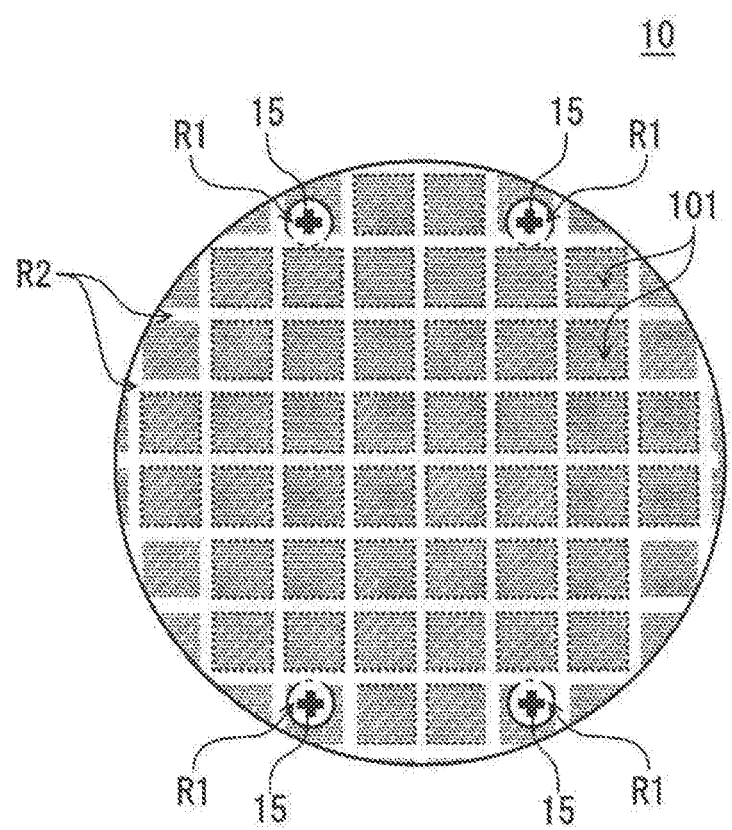

FIGS. 10A and 10B are a cross-sectional view taken along the line X-X in FIG. 2A and a schematic top view, respectively, of the semiconductor substrate after the second exposure step according to the present embodiment of the present invention. The protective film 40 and the metal film 16 are further removed along a second region R2, exposing the semiconductor layer 11 corresponding to the second region R2. In FIG. 10B, the protective film 40 is shown by hatching for the sake of convenience.

(7) Dicing Step (S7)

This step removes the exposed semiconductor layer along the second region, to divide the semiconductor substrate into a plurality of element chips. The dicing step can be performed by applying a plasma (first plasma) to the second region from the second principal surface side.

Figure 11:
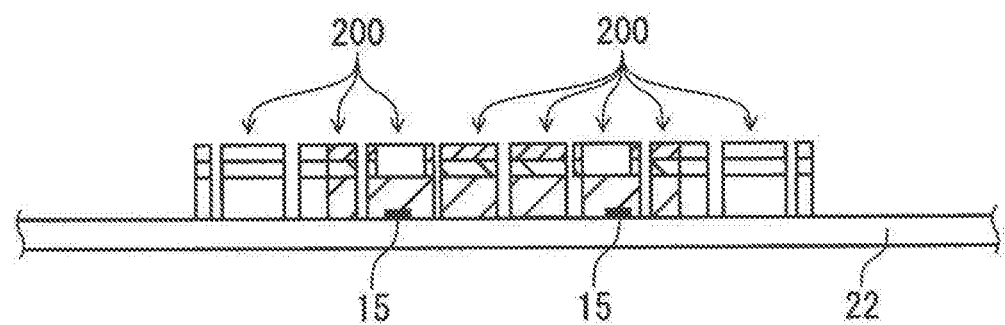
FIG. 11 is a cross-sectional view taken along the line X-X in FIG. 2A of the semiconductor substrate (element chips) after a dicing step according to the embodiment of the present invention.

FIG. 11 is a cross-sectional view taken along the line X-X in FIG. 2A of the semiconductor substrate after the dicing step according to the present embodiment. The semiconductor layer 11 is removed along the second region R2 and divided into a plurality of element chips 200.

Prior to the dicing step, a step of cleaning the second principal surface by a second plasma may be performed. The second plasma is usually generated under different conditions from those for generating the first plasma when performing dicing. The cleaning step is performed for, for example, further reducing the residue remaining after the first exposure step and/or the second exposure step. This can improve the quality of the plasma dicing.

Figure 12:
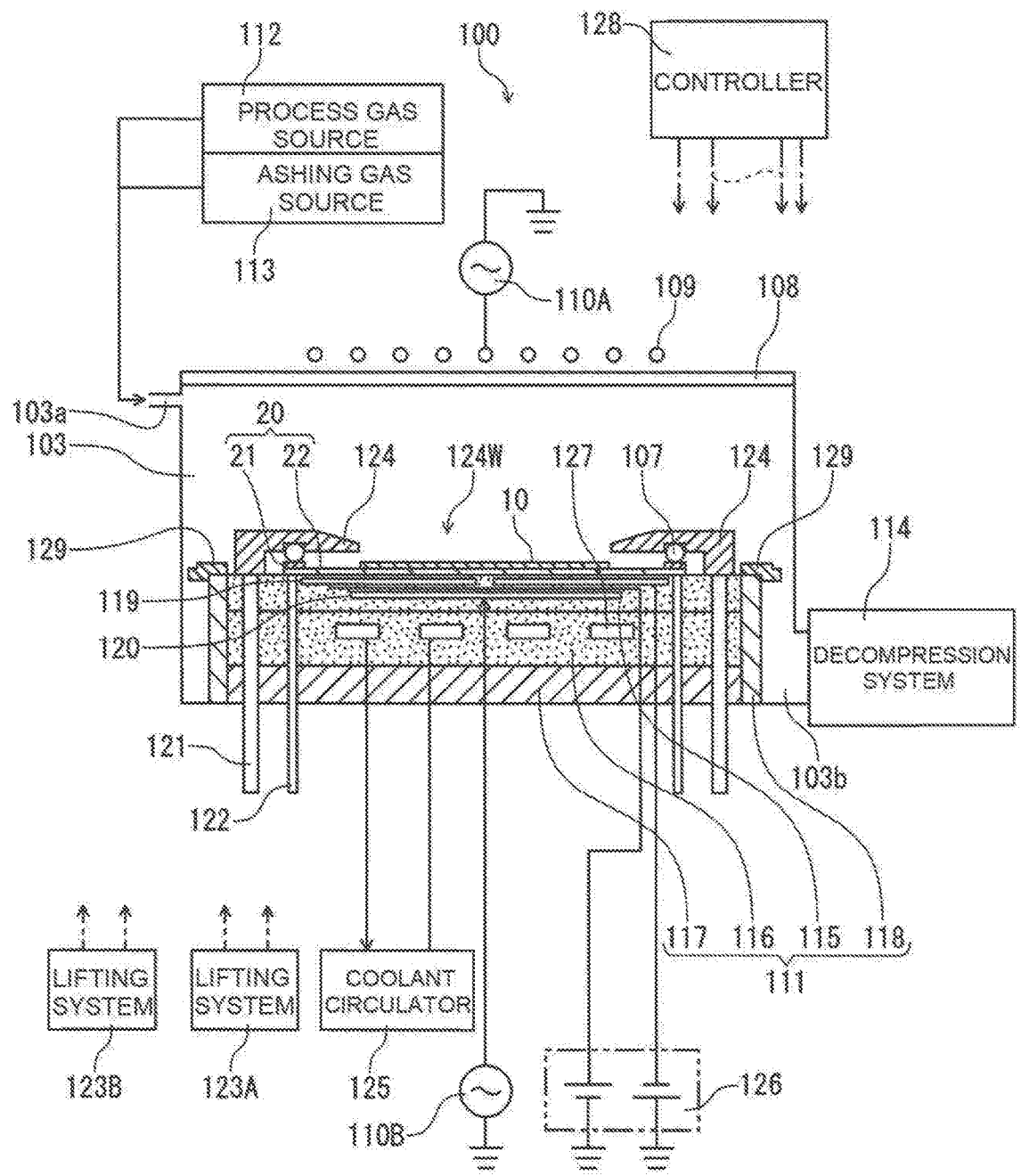
FIG. 12 is a schematic sectional diagram of a plasma processing apparatus.

Next, one embodiment of a plasma processing apparatus used in the dicing step will be specifically described. FIG. 12 is a schematic sectional diagram of a plasma processing apparatus. In FIG. 12, the semiconductor substrate is held on the conveying carrier. The structure of the plasma processing apparatus is not limited thereto.

(Plasma Processing Apparatus)

A plasma processing apparatus 100 includes a stage 111. A conveying carrier 20 is set on the stage 111, with the surface holding a semiconductor substrate 10 of a holding sheet 22 faced upward. The stage 111 has such a size that the whole conveying carrier 20 can be seated thereon. Above the stage 111, a cover 124 having a window 124W for exposing at least part of the semiconductor substrate 10 therefrom is arranged. The cover 124 is provided with holding members 107 for holding the frame 21 downward while the frame 21 is on the stage 111. The holding members 107 are preferably a member that can achieve point contact with the frame 21 (e.g., a coil spring or an elastic resin). This can correct a distortion of the frame 21, while restricting a thermal communication between the frame 21 and the cover 124.

The stage 111 and the cover 124 are arranged in a vacuum chamber 103. The vacuum chamber 103 is approximately cylindrical with the top open. The open top is closed by a dielectric member 108 serving as a lid. Examples of the constituent material of the vacuum chamber 103 include aluminum, stainless steel (SUS), and aluminum with anodic oxide coating. Examples of the constituent material of the dielectric member 108 include yttrium oxide ($Y_2O_3$), aluminum nitride (AlN), alumina ($Al_2O_3$), quartz ($SiO_2$), and other dielectric materials. Above the dielectric member 108, a first electrode 109 serving as an upper electrode is arranged. The first electrode 109 is electrically connected to a first high-frequency power source 110A. The stage 111 is positioned on the bottom side in the vacuum chamber 103.

The vacuum chamber 103 is provided with a gas inlet 103a and a gas outlet 103b. The gas inlet 103a is connected to plasma-generating gas (process gas) supply sources, i.e., a process gas source 112 and an ashing gas source 113, each through a conduit. The gas outlet 103b is connected to a decompression system 114 including a vacuum pump for exhausting the gas within the vacuum chamber 103 to reduce the pressure therein. While supplying a process gas into the vacuum chamber 103, the first electrode 109 is supplied with a high-frequency power from the first high-frequency power source 110A. A plasma is thus generated in the vacuum chamber 103.

The stage 111 includes an electrode layer 115, a metal layer 116, and a base table 117 supporting the electrode layer 115 and the metal layer 116, each being approximately circular. The stage 111 further includes a peripheral member 118 surrounding the electrode layer 115, the metal layer 116, and the base table 117. The peripheral member 118 is formed of a metal having electrical conductivity and etching resistance, and serves to protect the electrode layer 115, the metal layer 116, and the base table 117 from plasma exposure. On the top surface of the peripheral member 118, an annular circumferential ring 129 is provided. The circumferential ring 129 serves to protect the top surface of the peripheral member 118 from plasma exposure. The electrode layer 115 and the circumferential ring 129 are formed of, for example, the dielectric material as listed above.

Within the electrode layer 115, an electrode for electrostatic chucking (hereinafter, ESC electrode 119), and a second electrode 120 electrically connected to a second high-frequency power source 110B are disposed. The ESC electrode 119 is electrically connected to a DC power source 126. The ESC electrode 119 and the DC power source 126 constitute an electrostatic chuck system. The electrostatic chuck system pulls the holding sheet 22 onto the stage 111 and secures it thereto. Although a description will be made below of a case where the electrostatic chuck system is used as a securing system for securing the holding sheet 22 to the stage 111, this should not be taken as a limitation. A clamp (not shown) may be used for securing the holding sheet 22 to the stage 111.

The metal layer 116 is formed of, for example, aluminum with an anodic oxidation coating. The metal layer 116 contains a coolant channel 127 configured to cool the stage 111. By cooling the stage 111, the holding sheet 22 set on the stage 111 is cooled down, and the cover 124 partially in contact with the stage 111 is also cooled down. This protects the semiconductor substrate 10 and the holding sheet 22 from being damaged by being heated during plasma processing. A coolant in the coolant channel 127 is circulated by a coolant circulator 125.

Around the peripheral portion of the stage 111, a plurality of support members 122 extending through the stage 111 are provided. The support members 122 support the frame 21 of the conveying carrier 20. The support members 122 are driven by a first lifting system 123A, and move upward and downward. The conveying carrier 20 having delivered into the vacuum chamber 103 is passed onto the support members 122 at a predetermined raised position. Then the support members 122 descend until their top surfaces become flush with or lower than the top surface of the stage 111, which sets the conveying carrier 20 at a predetermined position on the stage 111.

A plurality of lifting rods 121 are coupled to the peripheral edge of the cover 124, to lift and lower the cover 124. The lifting rods 121 are driven by a second lifting system 123B. The lifting and lowering operation of the cover 124 by the second lifting systems 123B can be controlled independently from the operation by the first lifting system 123A.

Figure 13:
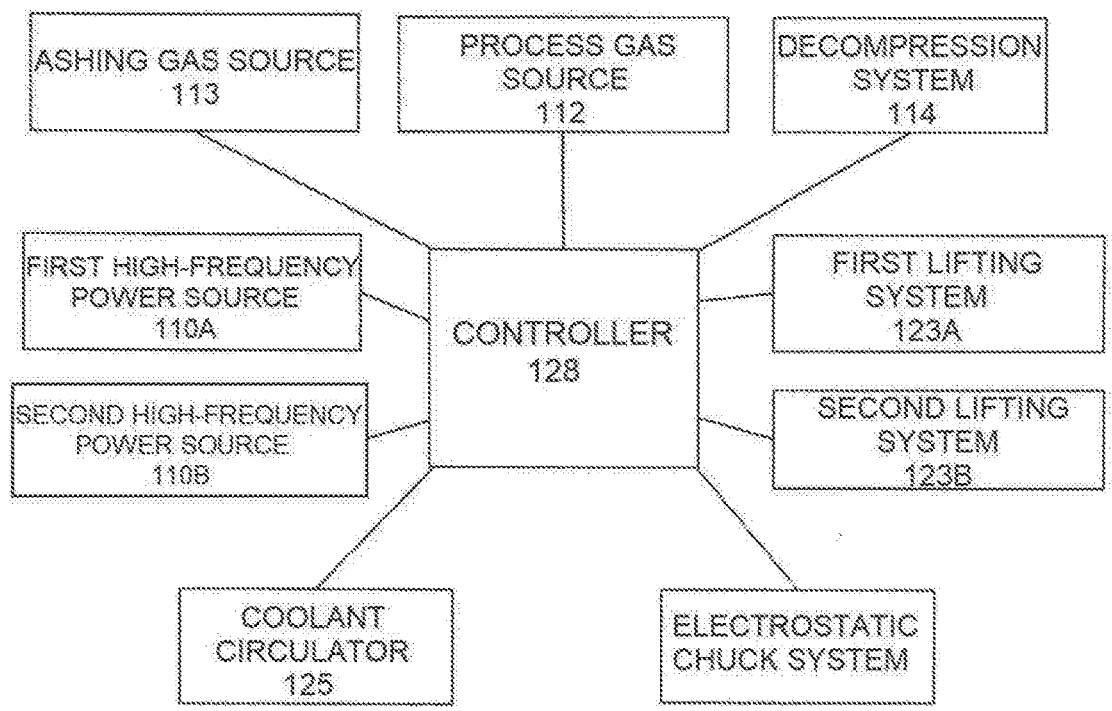
FIG. 13 is a block diagram of the plasma processing apparatus used in one embodiment of the present invention.

A controller 128 is configured to control operations of component elements of the plasma processing unit 100 including the first high-frequency power source 110A, the second high-frequency power source 110B, the process gas source 112, the ashing gas source 113, the decompression system 114, the coolant circulator 125, the first and second lifting systems 123A and 123B, and the electrostatic chuck system. FIG. 13 is a block diagram of the plasma processing apparatus used in the present embodiment.

After the conveying carrier 20 holding the semiconductor substrate 10 is delivered into the vacuum chamber 103, the semiconductor substrate 10 is subjected to etching while being seated on the stage 111.

When delivering the semiconductor substrate 10, within the vacuum chamber 103, the cover 124 is lifted to a predetermined position by means of the lifting rods 121. A gate valve (not shown) opens to allow the conveying carrier 20 to be delivered into the vacuum chamber 103. The support members 122 are on standby at a raised position. When the conveying carrier 20 reaches a predetermined position above the stage 111, the conveying carrier 20 is passed onto the support members 122. The conveying carrier 20 is placed onto the support members 122, with the adhesive side 22X of the holding sheet 22 faced upward.

After the conveying carrier 20 is passed onto the support members 122, the vacuum chamber 103 is closed in a hermetically sealed state. Next, the support members 122 start descending. When the support members 122 have descended until their top surfaces become flush with or lower than the top surface of the stage 111, the conveying carrier 20 is set on the stage 111. Then the lifting rods 121 are driven to lower the cover 124 to a predetermined position. The distance between the cover 124 and the stage 111 is adjusted so that the holding members 107 in the cover 124 each come in point-contact with the frame 21. In this way, the frame 21 is pressed downward by the holding members 107, and covered with the cover 124, with at least part of the semiconductor substrate 10 exposed from the window 124W.

The cover 124 is, for example, doughnut-shaped having an approximately circular outline, and has a consistent width and thin thickness. The diameter of the window 124W is smaller than the inner diameter of the frame 21, and the outer diameter thereof is greater than the outer diameter of the frame 21. Therefore, when the cover 124 is lowered while the conveying carrier 20 is set on the stage at a predetermined position, the cover 124 can cover the frame 21, with at least part of the semiconductor substrate 10 exposed from the window 124W.

The cover 124 is formed of, for example, a dielectric such as ceramics (e.g., alumina, aluminum nitride) or quarts, or a metal such as aluminum or aluminum with an anodic oxidation coating. The holding members 107 can be formed of the aforementioned dielectric or metal, or a resin material.

After the conveying carrier 20 is passed onto the support members 122, a voltage is applied to the ESC electrode 119 from the DC power source 126. By doing this, the holding sheet 22 is brought into contact with the stage 111 and concurrently, is electrostatically chucked on the stage 111. The voltage application to the ESC electrode 119 may be initiated after the holding sheet 22 is set on (or comes in contact with) the stage 111.

Upon completion of etching, the gas in the vacuum chamber 103 is evacuated, and the gate valve opens. The conveying carrier 20 holding a plurality of element chips is delivered out of the plasma processing unit 100 by means of a conveying system having entered through the gate valve. After the conveying carrier 20 is delivered out, the gate valve is immediately closed. The conveying carrier 20 may be delivered out by performing the above-mentioned procedures of setting the conveying carrier 20 on the stage 11 in the reverse order. Specifically, after the cover 124 is lifted to a predetermined position, the voltage applied to the ESC electrode 119 is cut off, to release the chucking of the conveying carrier 20 to the stage 111. Then, the support members 122 are raised. After the support members 122 reach a predetermined raised position, the conveying carrier 20 is delivered out of the vacuum chamber 103.

The conditions for generating a plasma (first plasma) used for etching the semiconductor layer may be set according to the material of the semiconductor layer and other factors.

The semiconductor layer is plasma-etched by, for example, a Bosch process. In the Bosch process, the semiconductor layer is etched vertically in the depth direction. When the semiconductor layer contains Si, the Bosch process repeats a film deposition step, a deposited-film etching step, and a Si etching step in this order, thereby to dig the semiconductor layer in the depth direction.

The film deposition step is carried out, for example, under the following conditions: while supplying $C_4F_8$ as a process gas at a rate of 150 sccm or more and 250 sccm or less, the pressure in the vacuum chamber is controlled to 15 Pa or more and 25 Pa or less, with the input power to the first electrode from the first high-frequency source set at 1500 W or more and 2500 W or less, and the input power to the second electrode from the second high-frequency power source set at 0 W or more and 50 W or less; the processing time is 2 sec or more and 15 sec or less.

The deposited-film etching step is carried out, for example, under the following conditions: while supplying $SF_6$ as a process gas at a rate of 200 sccm or more and 400 sccm or less, the pressure in the vacuum chamber is controlled to 5 Pa or more and 15 Pa or less, with the input power to the first electrode from the first high-frequency power source set at 1500 W or more and 2500 W or less, and the input power to the second electrode from the second high-frequency power source set at 300 W or more and 1000 W or less; the processing time is 2 sec or more and 10 sec or less.

The Si etching step is carried out, for example, under the following conditions: while supplying $SF_6$ as a process gas at a rate of 200 sccm or more and 400 sccm or less, the pressure in the vacuum chamber is controlled to 5 Pa or more and 15 Pa or less, with the input power to the first electrode from the first high-frequency power source set at 1500 W or more and 2500 W or less, the input power to the second electrode from the second high-frequency power source set at 50 W or more and 500 W or less; the processing time is 10 sec or more and 20 sec or less.

By repeating the film deposition step, the deposited-film etching step, and the Si etching step under the conditions as above, the semiconductor layer containing Si can be etched vertically in the depth direction at a rate of 10 μm/min or more and 20 μm/min or less.

According to the element chip manufacturing method of the present invention, high quality plasma dicing can be performed. The element chip manufacturing method of the present invention is therefore useful as a method of manufacturing element chips from various semiconductor substrates.

REFERENCE NUMERALS

10: substrate
  10a: notch
  10X: first principal surface
  10Y: second principal surface
  101: element region
  102: dicing region
11: semiconductor layer
  15: alignment mark
  16: metal film
  R1: first region
  R2: second region
20: conveying carrier
  21: frame
    21a: notch
    21b: corner cut
  22: holding sheet
  22X: adhesive side
  22Y: non-adhesive side
40: protective film
100: plasma processing apparatus
  103: vacuum chamber
    103a: gas inlet
    103b: gas outlet
  108: dielectric member
  109: first electrode
  110A: first high-frequency power source
  110B: second high-frequency power source
  111: stage
  112: process gas source
  113: ashing gas source
  114: decompression system
  115: electrode layer
  116: metal layer
  117: base table
  118: peripheral member
  119: ESC electrode
  120: second electrode
  121: lifting rod
  122: support member
  123A: first lifting system
  123B: second lifting system
  124: cover
    124W: window
  125: coolant circulator
  126: DC power source
  127: coolant channel
  128: controller
  129: circumferential ring
200: element chip
300: infrared camera

What is claimed is:

1. An element chip manufacturing method comprising:
a preparation step of preparing a semiconductor substrate including a first layer having a first principal surface, and a second layer laminated on the first layer and having a second principal surface opposite the first principal surface, the first principal surface provided with a plurality of element regions, a dicing region defining the element regions, and an alignment mark, wherein the first layer incudes a semiconductor layer, and the second layer includes a metal layer adjacent to the semiconductor layer;

a first exposure step of irradiating a first laser beam that is absorbed in the metal film and passes through the semiconductor layer, from the second principal surface side to a first region corresponding to the alignment mark on the second principal surface, to remove the metal film at the first region and expose the semiconductor layer corresponding to the first region;

a calculation step of imaging the semiconductor substrate from the second principal surface side, with a camera capable of sensing an electromagnetic wave that passes through the semiconductor layer, to detect a position of the alignment mark through the semiconductor layer corresponding to the first region, and then calculating a second region corresponding to the dicing region on the second principal surface, based on the detected position of the alignment mark;

a second exposure step of irradiating a second laser beam to the second region from the second principal surface side, to remove the metal film along the second region and expose the semiconductor layer corresponding to the second region; and a dicing step of removing the exposed semiconductor layer along the second region after the second exposure step, to divide the semiconductor substrate into a plurality of element chips.

2. The element chip manufacturing method of claim 1, further comprising a protective film formation step of forming a protective film so as to cover the second principal surface of the semiconductor substrate, before the first exposure step, wherein in the first exposure step, the protective film is removed together with the metal film at the first region, and in the dicing step, the semiconductor layer is removed by applying a plasma to the second region.

3. The element chip manufacturing method of claim 1, further comprising an attaching step of attaching the semiconductor substrate at the first principal surface to a holding sheet, before the first exposure step.

4. The element chip manufacturing method of claim 1, wherein the first laser beam is an ultrashort pulse laser beam.

5. The element chip manufacturing method of claim 1, wherein the second laser beam is absorbed in the metal film and passes through the semiconductor layer.

* * * * *